United States Patent
Qian et al.

(10) Patent No.: US 9,671,537 B2
(45) Date of Patent: Jun. 6, 2017

(54) MULTI-LAYER COLOR FILTER FOR LOW COLOR ERROR AND HIGH SNR

(71) Applicant: OMNIVISION TECHNOLOGIES, INC., Santa Clara, CA (US)

(72) Inventors: Yin Qian, Milpitas, CA (US); Chen-Wei Lu, San Jose, CA (US); Jin Li, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/920,126

(22) Filed: Oct. 22, 2015

(65) Prior Publication Data

US 2017/0115436 A1    Apr. 27, 2017

(51) Int. Cl.
*H04N 5/225* (2006.01)
*G02B 5/20* (2006.01)

(52) U.S. Cl.
CPC ............. *G02B 5/208* (2013.01); *G02B 5/201* (2013.01); *H04N 5/2254* (2013.01)

(58) Field of Classification Search
CPC ....... G02B 5/208; G02B 5/201; H04N 5/2254
See application file for complete search history.

(56) References Cited

U.S. PATENT DOCUMENTS

| 8,408,821 B2* | 4/2013 | Wu ......................... H04N 5/33 348/342 |
| 8,436,308 B2 | 5/2013 | Choe et al. |
| 2015/0381907 A1* | 12/2015 | Boettiger ............... H04N 5/332 348/164 |

* cited by examiner

*Primary Examiner* — Padma Haliyur
(74) *Attorney, Agent, or Firm* — Blakely Sokoloff Taylor & Zafman LLP

(57) ABSTRACT

Embodiments are described of a color filter array including a plurality of tiled minimal repeating units. Each minimal repeating unit includes an invisible-wavelength filter layer including a plurality of filters and a visible-wavelength filter layer positioned on the invisible-wavelength filter layer and having a plurality of filters such that each filter from the visible-wavelength layer is optically coupled to a corresponding filter in the invisible-wavelength layer.

12 Claims, 6 Drawing Sheets

MULTI-LAYER COLOR FILTER FOR LOW COLOR ERROR AND HIGH SNR

TECHNICAL FIELD

The disclosed embodiments relate generally to image sensors and in particular, but not exclusively, to image sensors including a multi-layer color filter array (CFA).

BACKGROUND

Image sensors can be coupled with invisible-wavelength filters so that they can capture images at wavelengths outside the visible range of wavelengths, for instance in the infrared (IR) wavelength range. Two kinds of materials are used to make existing infrared filters: pigment-based materials and C-based materials. Pigment-based infrared filters are usually used in image sensors with pixel sizes less than 1.4 µm. They have high infrared transmittance that translates to a higher signal-to-noise ratio (SNR), but they cannot completely block visible wavelengths like blue and red so they create worse color error. C-based infrared filters are usually used in image sensors with pixel sizes greater than 1.4 µm. They completely block visible wavelengths like blue and red and so have smaller color error, but they have low infrared transmittance which translates into a lower SNR.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION OF THE ILLUSTRATED EMBODIMENTS

Embodiments are described of multi-layer color filters and image sensors that include a multi-layer color filter. Specific details are described to provide an understanding of the embodiments, but one skilled in the relevant art will recognize that the invention can be practiced without one or more of the described details or with other methods, components, materials, etc. In some instances well-known structures, materials, or operations are not shown or described in detail but are nonetheless encompassed within the scope of the invention.

Reference throughout this specification to "one embodiment" or "an embodiment" means that a described feature, structure, or characteristic can be included in one or more described embodiments, so that appearances of "in one embodiment" or "in an embodiment" do not necessarily all refer to the same embodiment. Furthermore, the described features, structures, or characteristics may be combined in any suitable manner in one or more embodiments.

Figure 1:
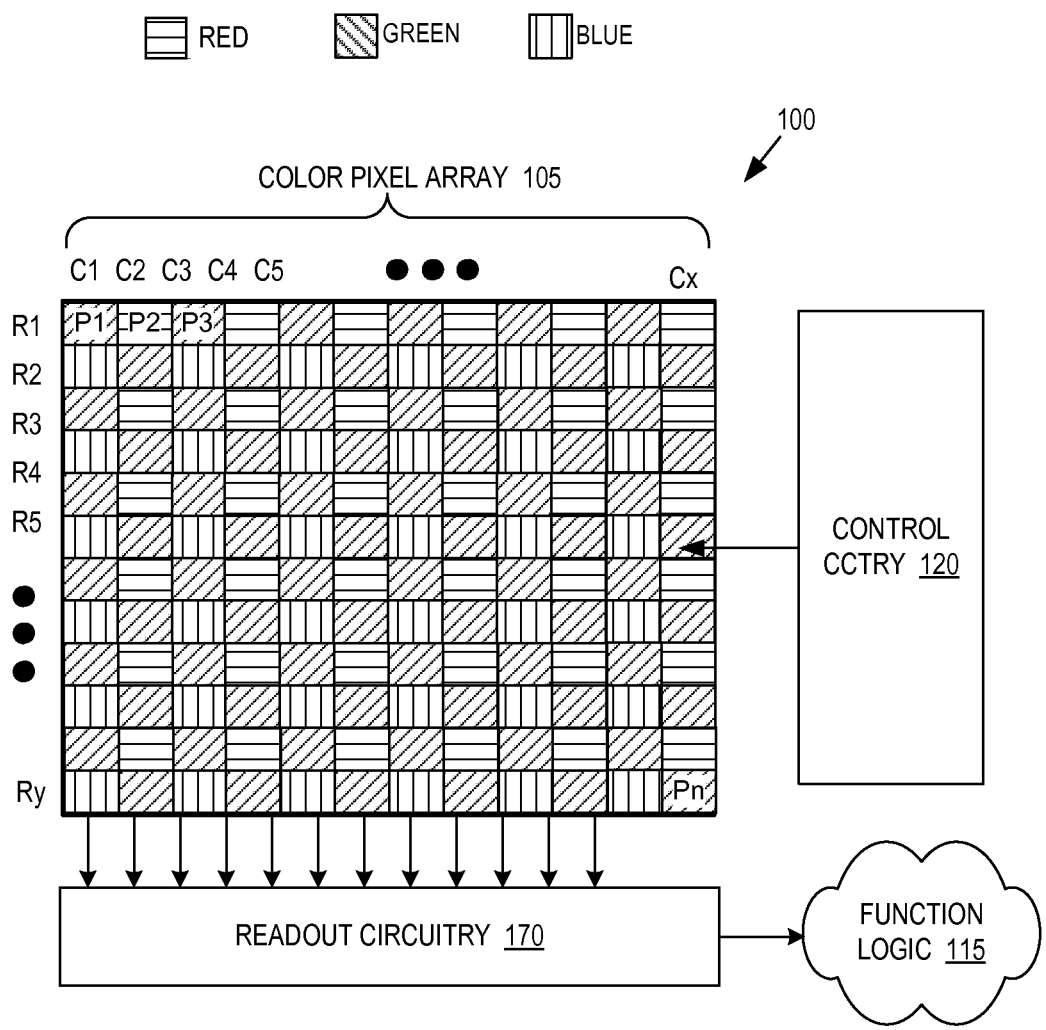
FIG. 1 is a schematic of an embodiment of an image sensor including a color filter array.
Figure 2A:
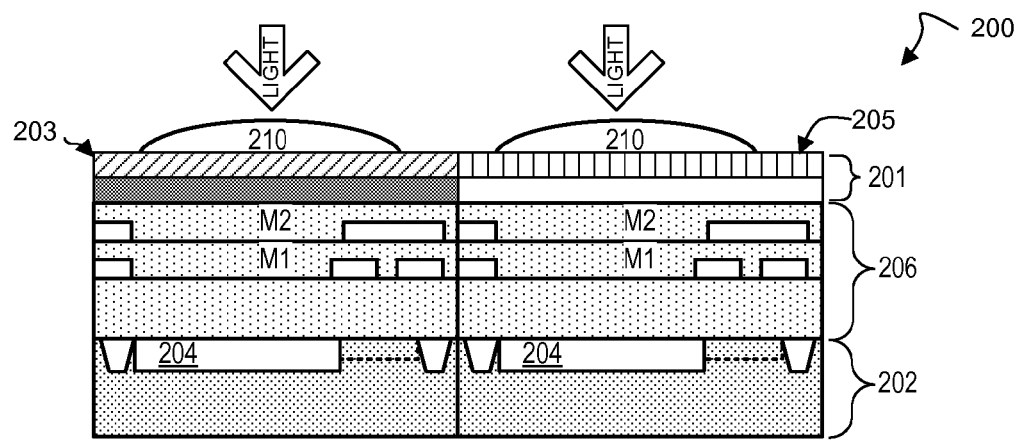
FIGS. 2A-2B are, respectively, cross-sections of embodiments of a pair of frontside-illuminated pixels and embodiments of a pair of backside-illuminated pixels.
Figure 2B:
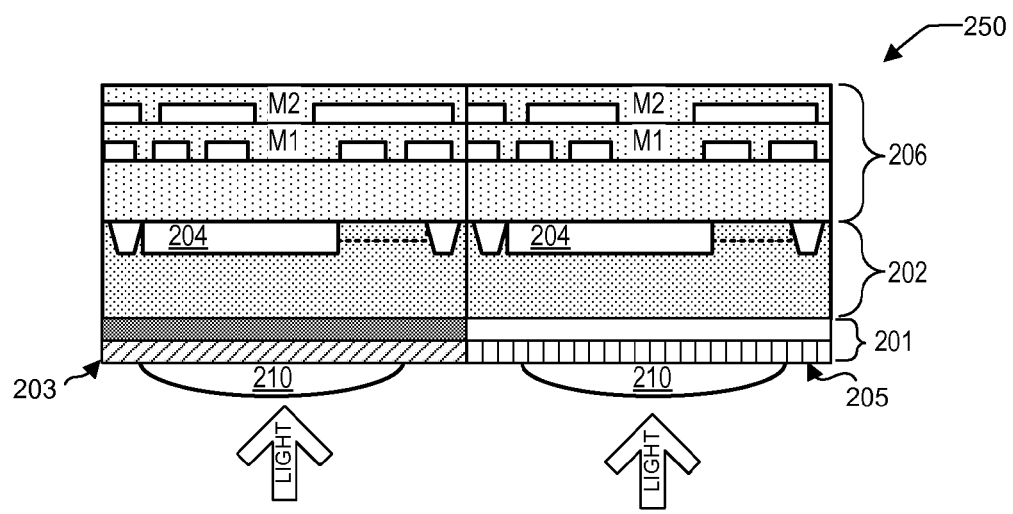

FIG. 1 illustrates an embodiment of a complementary metal oxide semiconductor (CMOS) image sensor 100 including a color pixel array 105, readout circuitry 170 coupled to the pixel array, function logic 115 coupled to the readout circuitry, and control circuitry 120 coupled to the pixel array. Color pixel array 105 is a two-dimensional ("2D") array of individual imaging sensors or pixels (e.g., pixels P1, P2 . . . , Pn) having X pixel columns and Y pixel rows. Color pixel array 105 can be implemented as a frontside-illuminated image sensor as shown in FIG. 2A, or as a backside-illuminated image sensor as shown in FIG. 2B. As illustrated, each pixel in the array is arranged into a row (e.g., rows R1 to Ry) and a column (e.g., column C1 to Cx) to acquire image data of a person, place, or object, which can then be used to render a 2D image of the person, place, or object. Color pixel array 105 assigns color to each pixel using a color filter array (CFA) coupled to the pixel array, as further discussed below in connection with the disclosed embodiments of color filter arrays.

After each pixel in pixel array 105 has acquired its image data or image charge, the image data is read out by readout circuitry 170 and transferred to function logic 115 for storage, additional processing, etc. Readout circuitry 170 can include amplification circuitry, analog-to-digital ("ADC") conversion circuitry, or other circuits. Function logic 115 can store the image data and/or manipulate the image data by applying post-image effects (e.g., crop, rotate, remove red eye, adjust brightness, adjust contrast, or otherwise). Function logic 115 can also be used in one embodiment to process the image data to correct (i.e., reduce or remove) fixed pattern noise. Control circuitry 120 is coupled to pixel array 105 to control operational characteristic of color pixel array 105. For example, control circuitry 120 can generate a shutter signal for controlling image acquisition.

FIG. 2A illustrates a cross-section of an embodiment of a pair of frontside-illuminated (FSI) pixels 200 in a CMOS image sensor. The front side of FSI pixels 200 is the side of substrate 202 upon which the photosensitive area 204 and associated pixel circuitry are disposed, and over which metal stack 206 for redistributing signals is formed. Metal stack 206 includes metal layers M1 and M2, which are patterned to create an optical passage through which light incident on FSI pixels 200 can reach photosensitive or photodiode ("PD") regions 204. To implement a color image sensor, the front side can include a multi-layer color filter array 201 with each of its color filters (only two individual two-layer filters 203 and 205 are illustrated in this particular cross section) disposed under a microlens 210 that can focus incident light onto PD region 204. Color filter array 201 can be a multi-layer color filter array formed with any of the minimal repeating units discussed herein.

FIG. 2B illustrates a cross-section of an embodiment of a pair of backside-illuminated (BSI) pixels 250 in a CMOS image sensor. As in FSI pixels 200, the front side of pixels 250 is the side of substrate 202 upon which the photosensitive regions 204 and associated pixel circuitry are disposed, and over which metal stack 206 is formed for redistributing signals. The backside is the side of substrate 202 opposite the front side. To implement a color image sensor, the backside can include multi-layer color filter array 201, with each of its individual filters (two-layer individual filters 203 and 205 are illustrated in this particular cross section) disposed under a microlens 210. Color filter array 201 can be a multi-layer color filter array formed with any of the minimal repeating units discussed herein. Microlenses 206 aid in focusing incident light onto photosensitive regions 204. Backside illumination of pixels 250 means that the metal interconnect lines in metal stack 206 do not obscure the path between the object being imaged and the photosensitive regions 204, resulting in greater signal generation by photosensitive regions 204.

Figure 3:
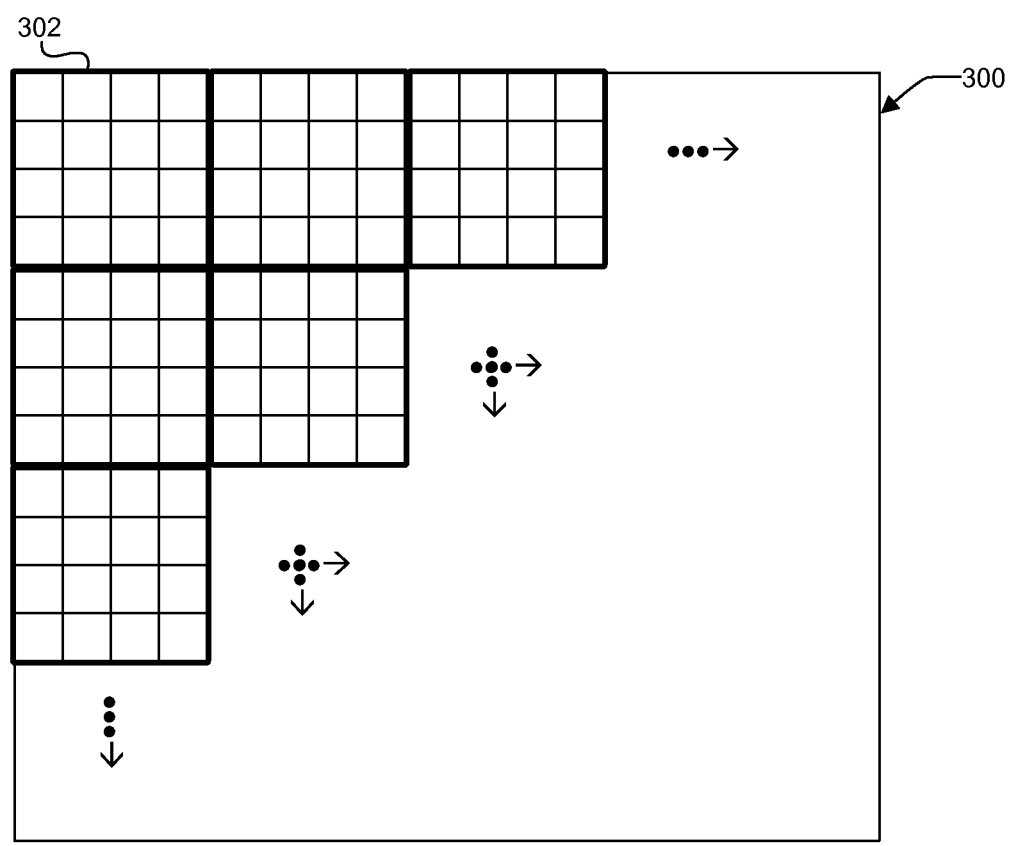
FIG. 3 is a diagram of an embodiment of a color filter array (CFA) formed by tiling multiple minimal repeating units (MRUs).

FIG. 3 illustrates a color filter array (CFA) 300 and a set of minimal repeating units (MRUs) that are tiled to form the CFA. CFA 300 includes a number of individual filters that substantially corresponds to the number of individual pixels in the pixel array to which the CFA is or will be coupled. Each individual filter in CFA 300 is optically coupled to a corresponding individual pixel in the pixel array and has a particular spectral photoresponse selected from a set of spectral photoresponses. A particular spectral photoresponse has high sensitivity to certain portions of the electromagnetic spectrum but low sensitivity to other portions of the spectrum. The pixels in the image sensor are not themselves colored, but because CFAs assign a separate photoresponse to each pixel by placing a filter over the pixel, it is common to refer to a pixel as a pixel of that particular photoresponse. Hence a pixel can be referred to as a "clear pixel" if it has no filter or is coupled to a clear (i.e., colorless or panchromatic) filter, as a "blue pixel" if coupled to a blue filter, as a "green pixel" if coupled to a green filter, as a "red pixel" if coupled to a red filter, and so on.

The individual filters in CFA 300 are grouped into minimal repeating units (MRUs) such as MRU 302, and MRUs 302 are tiled vertically and horizontally, as indicated by the arrows, to form CFA 300. A minimal repeating unit is a repeating unit such that no other repeating unit has fewer individual filters. A color filter array can include several different repeating units, but a repeating unit is not a minimal repeating unit if there is another repeating unit in CFA 300 with fewer individual filters. Other embodiments of CFA 300 can be tiled using an MRU that includes a greater or smaller number of pixels than illustrated for MRU 302 (see, e.g., FIGS. 4A-4B and 5A-5B).

Figure 4A:
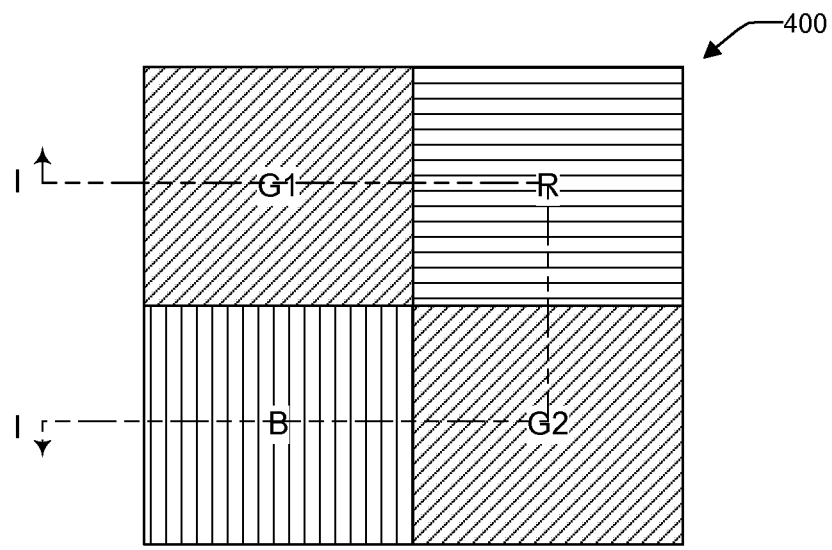
FIGS. 4A-4B are, respectively, a plan view and a cross-sectional view of an embodiment of a minimal repeating unit of a multi-layer filter. The cross-sectional view of FIG. 4B is taken substantially along section line I-I in FIG. 4A.
Figure 4B:
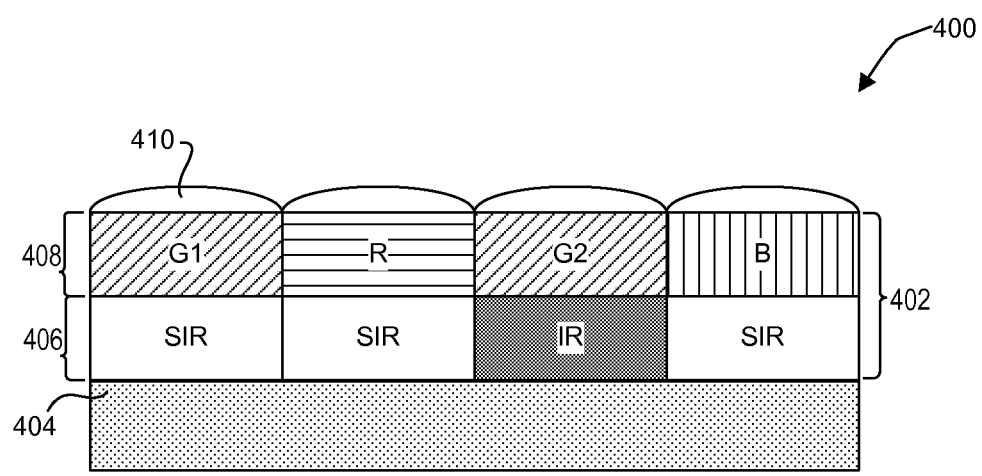

FIGS. 4A-4B together illustrate an embodiment of portion 400 of an image sensor. FIG. 4A is a plan view, FIG. 4B a cross-sectional view taken substantially along section line I-I in FIG. 4A. Image sensor portion 400 includes an MRU 402 with two layers: an invisible-wavelength layer 406 formed on the front side or backside of sensor 404 and a visible-wavelength filter layer 408 formed on top of invisible-wavelength layer 406 such that invisible-wavelength layer 406 is sandwiched between sensor 404 and visible-wavelength layer 408. The relative positions of filter layers 406 and 408 can of course be different in other embodiments. Microlens layer 410 can optionally be formed on visible-wavelength filter layer 408. Sensor layer 404 will typically include such items as pixels, support supporting circuitry, and so on; in one embodiment sensor layer 404 can include layers 202 and 206 shown in FIGS. 2A-2B, depending on whether it is a front side- or backside-illuminated sensor.

Each filter layer 406 and 408 includes a plurality of filters, so that each individual filter in invisible-wavelength filter layer 406 is optically coupled to a corresponding layer in visible-wavelength filter layer 408. Invisible-wavelength filter layer 406 has two different invisible photoresponse is: SIR and IR. The SIR filters are infrared cut-off filters designed to reflect or block infrared wavelengths while passing visible light. These filters typically have a blue hue to them as they also sometimes block some of the light from the longer red wavelengths. In contrast, the IR filters do substantially the opposite of the SIR filters: they are designed to pass infrared radiation while rejecting visible radiation. In the illustrated embodiment, filter layer 406 has three SIR filters and one IR filter, but other embodiments can have different numbers of each. Still other embodiments of invisible-wavelength filter layer 406 can include non-visible photoresponses other than infrared such as ultraviolet filters, x-ray filters, etc.

Visible-wavelength filter layer 408 has four filters but only three different visible photoresponses: red (R), green (G), and blue (B). The set of spectral photoresponses selected for use in an MRU, and hence in the CFA formed by tiling the MRUs, usually has at least three different photoresponses, but in some embodiments can include four or more. In the illustrated embodiment, filter layer 408 includes first and second green filters G1 and G2, one red filter R, and one blue filter B, but other embodiments can include different numbers of each. But in an embodiment of visible-wavelength filter layer 408 with four spectral photoresponses, the set of photoresponses can be a set of visible-wavelength photoresponses including red, green, blue, and clear or panchromatic (i.e., neutral or colorless). In still other embodiments visible-wavelength filter layer 408 can include other visible-wavelength photoresponses in addition to, or instead of, those listed. For instance, other embodiments can include cyan (C), magenta (M), yellow (Y) filters, and clear (i.e., colorless) filters. Still other embodiments can include visible photoresponses other than the ones shown.

Two-layer MRU 402 is assembled by placing visible-wavelength filter layer 408 on top of invisible-wavelength filter layer 406, such that each filter in filter layer 408 is optically coupled to a corresponding filter in filter layer 406. In the illustrated embodiment, green filter G1 is optically coupled to an SIR filter, red filter R is optically coupled to an SIR filter, second green filter G2 is optically coupled to an IR filter, and blue filter B is optically coupled to an SIR filter. In other embodiments, the correspondences between visible-wavelength filters and invisible-wavelength filters can be different than shown.

Figure 4C:
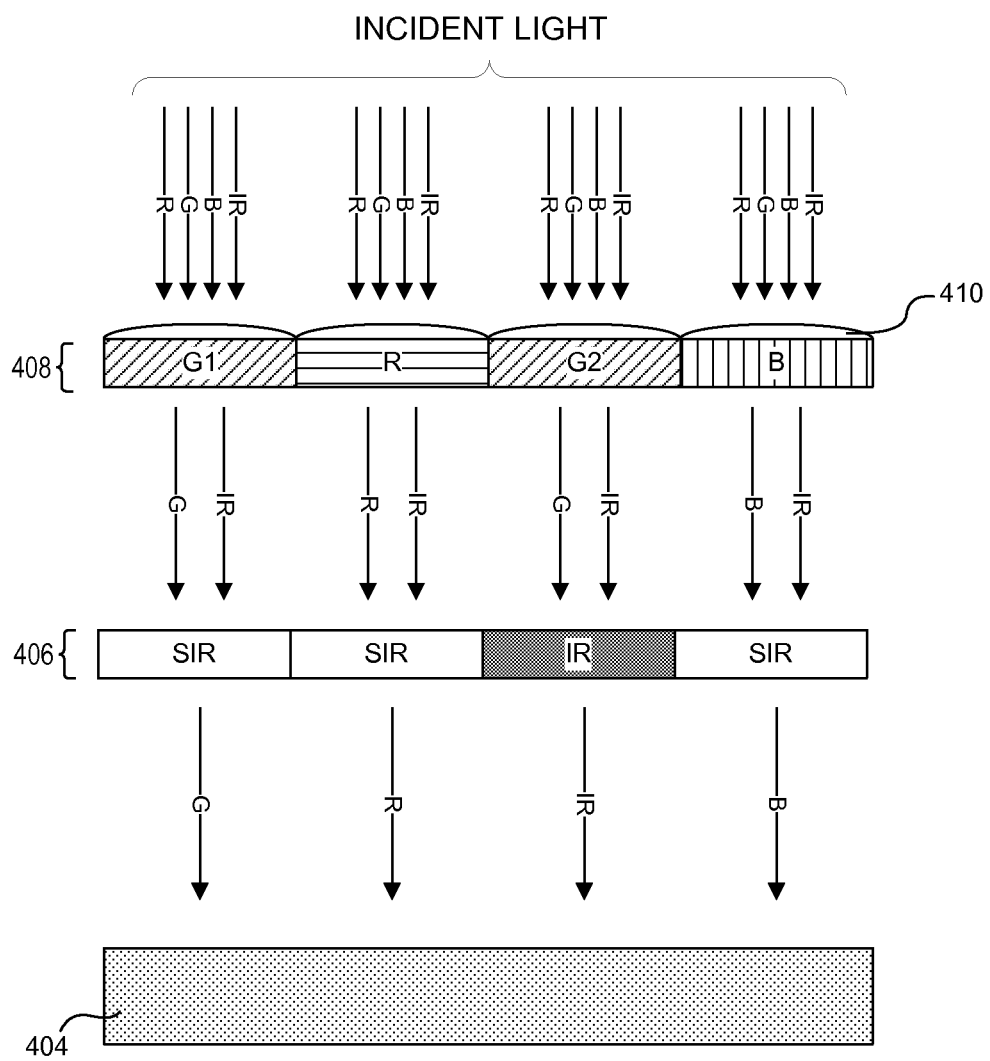
FIG. 4C is an exploded cross-sectional view of the minimal repeating unit of FIG. 4B illustrating an embodiment of operation of the multi-layer filter.

FIG. 4C illustrates an embodiment of the operation of two-layer MRU 402. In operation of MRU 402, light is incident on second layer 408 through microlenses 410, if present. The incident light includes red (R), green (G), blue (B), and infrared (IR) components. In the visible-wavelength filter layer 408, first green filter G1 allows green and IR components of the incident light to pass through, red filter R allows red and infrared components to pass, second green filter G2 allows green and infrared components to pass, and blue filter B allows blue and infrared components to pass.

The components of incident light that are allowed to pass through visible-wavelength filter layer 408 are then incident on invisible-wavelength filter layer 406. In invisible-wavelength filter layer 406, the SIR filter coupled to first green filter G1 blocks the IR component, allowing only the green component to pass; the SIR filter coupled to the red R filter blocks the IR component, allowing only the red component to pass; the IR filter coupled to second green filter G2 blocks the green component, allowing only IR component to pass; and the SIR filter coupled to the blue filter B blocks the IR component, allowing only the blue component to pass. As a result of filtering through both visible-wavelength filter layer 408 and invisible-wavelength filter layer 406, the light incident on the frontside or backside of image sensor 404 includes all four components (R, G, B, and IR) of the incident light, with each filtered component incident on an individual pixel in the pixel array within image sensor 404.

Figure 5A:
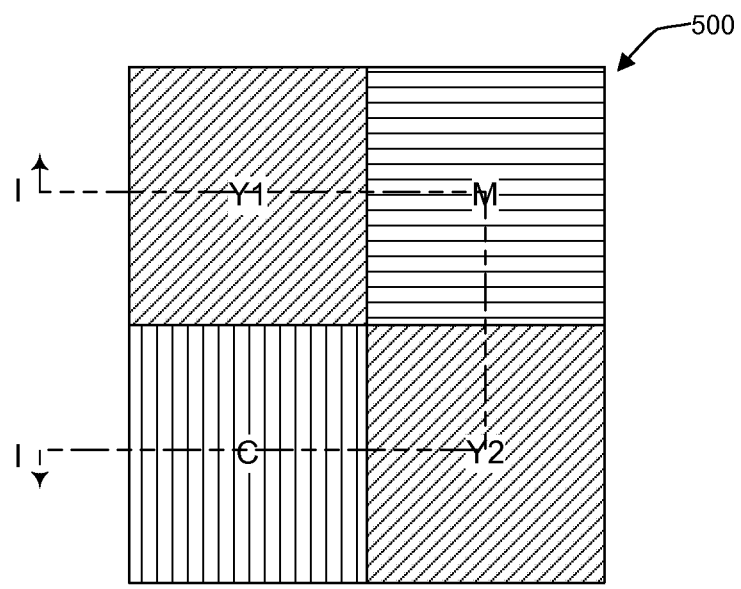
FIGS. 5A-5B are, respectively, a plan view and a cross-sectional view of another embodiment of a minimal repeating unit of a multi-layer filter. The cross-sectional view of FIG. 5B is taken substantially along section line I-I in FIG. 5A.
Figure 5B:
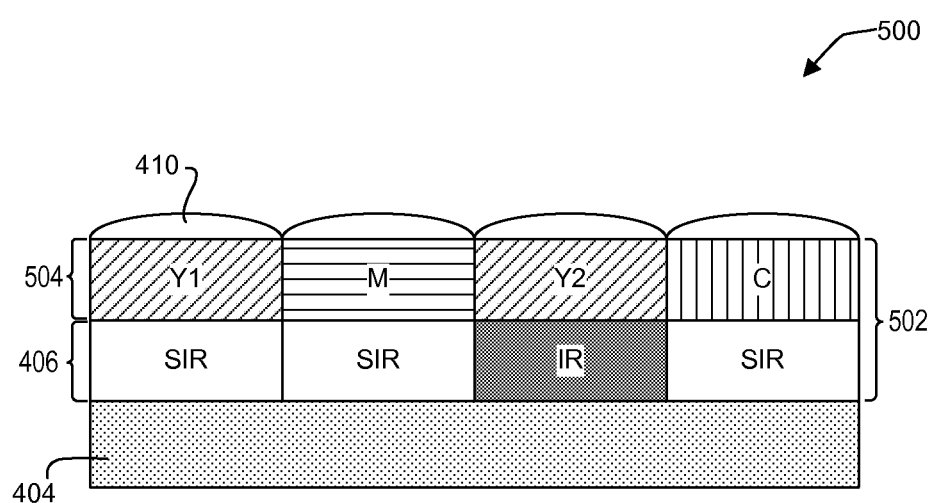

FIGS. 5A-5B together illustrate an embodiment of a portion 500 of an image sensor. FIG. 5A is a plan view, FIG. 5B a cross-sectional view taken substantially along section line I-I in FIG. 5A. Image sensor portion 500 is similar in most respects to image sensor portion 400: it includes an MRU 502 with an invisible-wavelength layer 406 formed on the front side or backside of a sensor 404, as well as a visible-wavelength filter layer 504 formed on top of invisible-wavelength layer 406. Microlens layer 410 can optionally be formed on visible-wavelength filter layer 504.

As in MRU 402, invisible-wavelength filter layer 406 has two different invisible photo responses: SIR and IR. The primary difference between MRU 502 and MRU 402 is that in MRU 502 the visible-wavelength filter layer 504 uses a different set of visible photo responses: instead of using the red, green, blue (RGB) primary color set, filter layer 504 uses the magenta, yellow and cyan (CMY) primary color set. In MRU 502, then, visible-wavelength filter layer 504 includes first and second yellow filters Y1 and Y2, one magenta filter M, and one cyan filter C.

Two-layer MRU 502 is assembled by placing visible-wavelength filter layer 504 on top of invisible-wavelength filter layer 406, such that each filter in filter layer 504 is optically coupled to a corresponding filter in filter layer 406. In the illustrated embodiment, yellow filter Y1 is optically coupled to an SIR filter, magenta filter M is optically coupled to an SIR filter, second yellow filter Y2 is optically coupled to an IR filter, and cyan filter C is optically coupled to an SIR filter. In other embodiments, the correspondences between visible-wavelength filters and invisible-wavelength filters can be different than shown. More generally, in different embodiments the IR filter can be coupled to a color filter whose color represents luminance or a luminance proxy, while the SIR filters can be coupled to color filters whose colors are used to represent chrominance, luminance, or both. Two-layer MRU 502 operates analogously to MRU 402, as shown in FIG. 4C.

The above description of embodiments, including what is described in the abstract, is not intended to be exhaustive or to limit the invention to the described forms. Specific embodiments of, and examples for, the invention are described for illustrative purposes, but various equivalent modifications are possible within the scope of the invention in light of the above detailed description, as those skilled in the relevant art will recognize.

The terms used in the following claims should not be interpreted to limit the invention to the specific embodiments disclosed in the specification and the claims. Rather, the scope of the invention is to be determined entirely by the following claims, which are to be interpreted using established claim interpretation doctrines.

The invention claimed is:

1. A color filter array comprising:
a plurality of tiled minimal repeating units, each minimal repeating unit comprising:
an invisible-wavelength filter layer including a plurality of filters, the plurality of filters in the invisible-wavelength filter layer including at least three filters having a first invisible photoresponse and a filter having a second invisible photoresponse; and
a visible-wavelength filter layer positioned on the invisible-wavelength filter layer and having a plurality of filters such that each filter from the visible-wavelength layer is optically coupled to a corresponding filter in the invisible-wavelength layer, wherein the plurality of filters in the visible-wavelength filter layer includes a filter having a first visible photoresponse, a pair of filters having a second visible photoresponse, and a filter having a third visible photoresponse;
wherein the individual filter having the second invisible photoresponse is optically coupled to one of the pair individual filters with the second visible photoresponse, and
wherein the filters with the first and third visible photoresponses and the other filter of the pair of filters with the second visible photoresponse are optically coupled to filters with the first invisible photoresponse.

2. The color filter array of claim 1 wherein the first visible photoresponse is red, the second visible photoresponse is green, and the third visible photoresponse is blue.

3. The color filter array of claim 2 wherein the first invisible photoresponse is infrared-blocking and the second invisible photoresponse is infrared-passing.

4. The color filter array of claim 2 wherein the first, second, and third visible photoresponses are arranged in a Bayer pattern.

5. The color filter array of claim 1 wherein the first visible photoresponse is magenta, the second visible photoresponse is yellow, and the third visible photoresponse is cyan.

6. The color filter array of claim 5 wherein the first invisible photoresponse is infrared-blocking and the second invisible photoresponse is infrared-passing.

7. An image sensor comprising:
a pixel array including a plurality of individual pixels;
a color filter array positioned over and optically coupled to the pixel array, the color filter array comprising a plurality of tiled minimal repeating units, each minimal repeating unit comprising:
an invisible-wavelength filter layer including a plurality of filters, the plurality of filters in the invisible-wavelength filter layer including at least three filters having a first invisible photoresponse and a filter having a second invisible photoresponse; and
a visible-wavelength filter layer positioned on the invisible-wavelength filter layer and having a plurality of filters such that each filter from the visible-wavelength layer is optically coupled to a corresponding filter in the invisible-wavelength layer, wherein the plurality of filters in the visible-wavelength filter layer includes a filter having a first visible photoresponse, a pair of filters having a second visible photoresponse, and a filter having a third visible photoresponse;
wherein the individual filter having the second invisible photoresponse is optically coupled to one of the pair individual filters with the second visible photoresponse, and
wherein the filters with the first and third visible photoresponses and the other filter of the pair of filters with the second visible photoresponse are optically coupled to filters with the first invisible photoresponse.

8. The image sensor of claim 7 wherein the first visible photoresponse is red, the second visible photoresponse is green, and the third visible photoresponse is blue.

9. The image sensor of claim 8 wherein the first invisible photoresponse is infrared-blocking and the second invisible photoresponse is infrared-passing.

10. The image sensor of claim 8 wherein the first, second, and third visible photoresponses are arranged in a Bayer pattern.

11. The image sensor of claim 7 wherein the first visible photoresponse is magenta, the second visible photoresponse is yellow, and the third visible photoresponse is cyan.

12. The image sensor of claim 11 wherein the first invisible photoresponse is infrared-blocking and the second invisible photoresponse is infrared-passing.

* * * * *